(12) United States Patent
Lou et al.

(10) Patent No.: US 11,244,627 B2
(45) Date of Patent: Feb. 8, 2022

(54) DISPLAY PANEL, DISPLAY SCREEN AND CONTROL METHOD THEREOF

(71) Applicant: YUNGU (GU'AN) TECHNOLOGY CO., LTD., Langfang (CN)

(72) Inventors: Junhui Lou, Langfang (CN); Li Lin, Langfang (CN); Shixing Cai, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/822,043

(22) Filed: Mar. 18, 2020

(65) Prior Publication Data
US 2020/0402465 A1      Dec. 24, 2020

Related U.S. Application Data

(63) Continuation of application No. PCT/CN2019/073945, filed on Jan. 30, 2019.

(30) Foreign Application Priority Data

Aug. 14, 2018   (CN) .......................... 201810925384.6

(51) Int. Cl.
    *G09G 3/3266* (2016.01)
    *G09G 3/3216* (2016.01)
    (Continued)

(52) U.S. Cl.
    CPC ......... *G09G 3/3266* (2013.01); *G09G 3/3216* (2013.01); *G09G 3/3283* (2013.01);
    (Continued)

(58) Field of Classification Search
    CPC ... G09G 3/3266; G09G 3/316; H01L 27/3276
    See application file for complete search history.

(56) References Cited

U.S. PATENT DOCUMENTS 8,653,569 B2    2/2014   Kashio et al.
10,209,541 B2 *  2/2019  Kim .................. G02F 1/133707
(Continued)

FOREIGN PATENT DOCUMENTS

CN          1454030 A    11/2003
CN          1455629 A    11/2003
(Continued)

OTHER PUBLICATIONS

First Office Action of Chinese application No. 2018109253846.
(Continued)

*Primary Examiner* — Kevin M Nguyen
(74) *Attorney, Agent, or Firm* — Kilpatrick Townsend & Stockton

(57) ABSTRACT

The present application relates to a display panel, a display screen and a control method thereof, and a display terminal and a driving method thereof. The first electrodes in the display panel have a one-to-one correspondence with the pixel circuits, and a second electrode is a full-surface electrode, at least a scanning line and at least a data line are connected to the pixel circuit, and the scanning lines control the turning on and turning off of the pixel circuit. When the pixel circuit is turned on, the data line provides a driving current for the first electrode to control the illumination of the sub-pixel. The scanning lines control the turning on and off of the pixel circuit, which requires only a switching voltage required by the pixel circuit, thereby greatly reducing a load current of the scanning line.

18 Claims, 28 Drawing Sheets

(51) Int. Cl.
*G09G 3/3283* (2016.01)
*H01L 27/32* (2006.01)

(52) U.S. Cl.
CPC ...... *H01L 27/3276* (2013.01); *H01L 27/3288* (2013.01); *G09G 2310/0286* (2013.01); *G09G 2320/064* (2013.01); *H01L 27/3234* (2013.01); *H01L 2251/306* (2013.01); *H01L 2251/308* (2013.01)

(56) References Cited

U.S. PATENT DOCUMENTS

| | | | |
|---|---|---|---|
| 2003/0201445 A1 | 10/2003 | Park et al. | |
| 2003/0205970 A1 | 11/2003 | Park et al. | |
| 2005/0140281 A1 | 6/2005 | Park | |
| 2006/0170111 A1* | 8/2006 | Isa | H01L 21/288 257/775 |
| 2009/0051640 A1* | 2/2009 | Tanaka | H01L 27/3276 345/92 |
| 2011/0043495 A1 | 2/2011 | Bang et al. | |
| 2012/0056174 A1 | 3/2012 | Kim et al. | |
| 2013/0050157 A1* | 2/2013 | Baek | G09G 3/2022 345/204 |
| 2013/0335365 A1 | 12/2013 | Kim et al. | |
| 2014/0204055 A1 | 7/2014 | Lu et al. | |
| 2014/0326968 A1 | 11/2014 | Lee | |
| 2015/0123952 A1 | 5/2015 | Kim et al. | |
| 2017/0061893 A1 | 3/2017 | Kwon et al. | |
| 2017/0365217 A1* | 12/2017 | An | G09G 3/3233 |
| 2018/0053032 A1* | 2/2018 | Ding | G06K 9/0004 |
| 2018/0260079 A1 | 9/2018 | Zhang | |
| 2019/0008014 A1 | 1/2019 | Ikeda et al. | |
| 2019/0025644 A1 | 1/2019 | Tan et al. | |
| 2019/0198585 A1 | 6/2019 | Chang et al. | |
| 2019/0355591 A1 | 11/2019 | Yamazaki et al. | |

FOREIGN PATENT DOCUMENTS

| | | |
|---|---|---|
| CN | 1638548 A | 7/2005 |
| CN | 2842649 Y | 11/2006 |
| CN | 101661941 A | 3/2010 |
| CN | 102760755 A | 10/2012 |
| CN | 103839516 A | 6/2014 |
| CN | 103941897 A | 7/2014 |
| CN | 203838671 U | 9/2014 |
| CN | 104617124 A | 5/2015 |
| CN | 102386203 A | 3/2016 |
| CN | 105914223 A | 8/2016 |
| CN | 106024807 A | 10/2016 |
| CN | 106878564 A | 6/2017 |
| CN | 108346684 A | 7/2018 |
| TW | 201521205 A | 6/2015 |
| TW | 201629586 A | 8/2016 |
| WO | 2018076857 A1 | 5/2018 |

OTHER PUBLICATIONS

International Search Report for application No. PCT/CN2019/073945.
Written Opinion for application No. PCT/CN2019/073945.
First Office Action of Taiwan application No. 108104267.
Second Office Action of Chinese application No. 2018109253846.
Organic Optoelectronics Technology, 20130831, WEN Shangsheng et al., p. 130.

* cited by examiner

A plurality of switching devices, scanning lines and data lines are formed. Each of the switching devices comprises a first terminal, a second terminal, and a control terminal, respectively, the data line is connected to the first terminal of the switching device, and the scanning line is connected to the control terminal of the switching device. ⎯ S1

A first electrode, a pixel defining layer, a light emitting structure layer, and a second electrode are correspondingly formed on a plurality of switching devices, the plurality of light emitting structure layers share the second electrode, and the first electrodes of the plurality of light emitting structure layers are respectively connected to the second terminal of the switching device. ⎯ S2

Fig. 12

DISPLAY PANEL, DISPLAY SCREEN AND CONTROL METHOD THEREOF

CROSS-REFERENCES TO RELATED APPLICATIONS

This application is a continuation application of international application PCT/CN2019/073945, filed on Jan. 30, 2019, which claims the priority benefit of Chinese patent application No. 201810925384. 6, entitled "DISPLAY PANEL, DISPLAY SCREEN AND CONTROL METHOD THEREFOR", and filed on Aug. 14, 2018. The entireties of these applications are incorporated by reference herein for all purposes.

TECHNICAL FIELD

The present application relates to the field of display technologies, and particularly to a display panel, a display screen, and a control method thereof.

BACKGROUND

With rapid development of the display terminal, users have an increasingly higher level of demands for the screen ratio. Since cameras, sensors, earpieces, etc. need to be installed on the top of the screen, conventionally, certain area on the top of the screen, such as the front bangs area of the Apple Phone iPhone X is usually reserved for installing the above components. The above configuration influences the overall consistency of the screen, therefore, a full display screen with better overall consistency has received more and more attention in the industry.

SUMMARY

Based on the above technical problems, the present application provides a display panel, and a display screen and a control method thereof involving in a full display screen.

The present application provides the following technical solutions:

A first aspect of the present disclosure provides a display panel comprising: a substrate; a pixel circuit, disposed on the substrate; a first electrode layer, disposed on the pixel circuit and comprising a plurality of first electrodes; a pixel defining layer, disposed on the first electrode and having a plurality of openings thereon; a second electrode, disposed on a light emitting structure layer; a scanning line and a data line are both connected to the pixel circuit; and the pixel circuit has a one-to-one correspondence with the first electrode, the light emitting structure layer is disposed in the opening of the pixel defining layer to form a plurality of sub-pixels, and the sub-pixel has a one-to-one correspondence with the first electrode, the second electrode is a surface electrode, the scanning line controls the turning on and turning off of the pixel circuit, and when the pixel circuit is turned on, the data line provides a drive current for the first electrode to control illumination of the sub-pixels.

Optionally, the pixel circuit comprises at least one switching device, and the switching device comprises a first terminal, a second terminal, and a control terminal; and the scanning line is connected to the control terminal of the switching device, the data line is connected to the first terminal of the switching device, and the first electrode is connected to the second terminal of the switching device.

Optionally, the first electrode is an anode, the second electrode is a cathode, and when the pixel circuit comprises one switching device, the switching device is a driving thin film transistor (TFT), and the first terminal is a source or a drain of the driving thin film transistor, the second terminal is a drain or a source of the driving thin film transistor, the control terminal is a gate of the driving thin film transistor; and the driving thin film transistor has a top gate structure or a bottom gate structure.

Optionally, the scanning line is disposed in the same layer as the gate; or the scanning line is disposed above or below the gate.

Optionally, the data line is disposed in the same layer as the first electrode.

Optionally, one or more of the first electrode, the second electrode, the data line, and the scanning line are made of a transparent conductive material.

Optionally, the transparent conductive material has a light transmittance of more than 90%.

Optionally, the transparent conductive material is indium tin oxide, indium zinc oxide, silver-doped indium tin oxide or silver-doped indium zinc oxide.

Optionally, a plurality of the scanning lines extend in parallel along a first direction, a plurality of the data lines extend in parallel along a second direction, the first direction intersects with the second direction and at least one side of the scanning line and/or the data line in the extending direction thereof has a wave shape.

Optionally, a first pitch is disposed between adjacent scanning lines, and the first pitch changes continuously or intermittently; and/or a second pitch is disposed between adjacent data lines, and the second pitch changes continuously or intermittently; and/or a width of the scanning line changes continuously or intermittently; and/or a width of the data line changes continuously or intermittently.

Optionally, both sides of the scanning line in the extending direction have a wave shape, and wave peaks of the two sides are oppositely disposed, and wave troughs are oppositely disposed; and/or both sides of the data line in the extending direction have a wave shape, and wave peaks of the two sides are oppositely disposed, and wave troughs are oppositely disposed.

Optionally, a first connecting portion is formed at a corresponding position of the wave troughs of the scanning line; and the first connecting portion is strip-shaped; and/or a second connecting portion is formed at a corresponding position of the wave troughs of the data line, and the second connecting portion is strip-shaped; and/or the first connecting portion is an electrical connecting area of the scanning line and the switching device; and/or the second connecting portion is an electrical connecting area of the data line and the switching device.

Optionally, the first electrode is circular, elliptical or dumbbell shaped.

Optionally, the sub-pixels are circular, elliptical or dumbbell shaped.

In a second aspect, the present application provides a display screen comprising at least a first display area and a second display area which are used for displaying a dynamic or static picture, and a photosensitive device being disposed below the first display area; wherein the first display area is provided with the display panel of the first aspect of the present application, and the second display area is provided with a passive matrix organic light emitting diode (PMOLED) display panel or an active matrix organic light emitting diode display (AMOLED) panel.

Optionally, when the display panel disposed in the second display area is an active matrix organic light emitting diode (AMOLED) display panel, and the cathode of the display panel of the first display area and the cathode of the display panel of the second display area share a full-surface electrode.

In a third aspect, the present application provides a display terminal comprising an apparatus body having a device area; any display screen according to the second aspect of the present application covering the apparatus body; wherein the device area is located below the first display area, and provided with a photosensitive device to collect light through the first display area.

Optionally, the device area is a grooved region; and the photosensitive device comprises a camera and/or a light sensor. In a fourth aspect, the present application provides a method for controlling any display panel according to the first aspect, comprising: transmitting a scanning signal to the scanning line, so that the scanning line controls a row of the pixel circuits to be turned on simultaneously; transmitting a data signal to the data line such that when the pixel circuit is turned on, the data line provides a drive current to the first electrode to control illumination of the sub-pixel.

Optionally, a luminance brightness of the sub-pixel is controlled by controlling a pulse width of the data line.

Optionally, the scanning signal and/or the data signal are transmitted to the scanning line or the data line through a driving chip.

Optionally, the driving chip is a passive matrix organic light emitting diode (PMOLED) driving chip.

Optionally, the scanning signal is transmitted to the scanning line through a shift register circuit.

A fifth aspect of the present application provides a method for controlling a display screen in the second aspect of the present application, comprising: transmitting a first scanning signal to a scanning line in a first display area, so that the scanning line controls a row of the pixels circuit to be turned on simultaneously; transmitting a first data signal to the data line in the first display area, so that when the pixel circuit is turned on, the data line provides a driving current for the first electrode to control the sub-pixel illumination; transmitting a second scanning signal to a scanning line in a second display area; transmitting a second data signal to the data line in the second display area; the first scanning signal and the second scanning signal being synchronized.

Optionally, the first scanning signal and the first data signal are transmitted by a first driving chip, and the second scanning signal and the second data signal are transmitted by a second driving chip, and the driving chip is a PMOLED driving chip.

Optionally, the first scanning signal, the first data signal, the second scanning signal, and the second data signal are transmitted by the same driving chip.

Optionally, a frequency of the first scanning signal is an integer multiple of a frequency of the second scanning signal, or the frequency of the second scanning signal is an integer multiple of the frequency of the first scanning signal.

Optionally, when the second display area is an AMOLED display panel, the second scanning signal is transmitted to the scanning line in the second display area, and the second data signal is transmitted to the data line in the second display area. Specifically, the second scanning signal is transmitted to the scanning line in the second display area, and the second data signal is transmitted to the data line in the second display area to control the current of a power line to be input to corresponding sub-pixels through the driving transistor to control illumination of corresponding sub-pixel.

The technical solution of the present application has the following advantages:

The display panel provided by the present application comprises a substrate; a pixel circuit disposed on the substrate; a first electrode layer disposed on the pixel circuit and comprising a plurality of first electrodes; a pixel defining layer disposed on the first electrode and having a plurality of openings thereon; a second electrode disposed on a light emitting structure layer; a scanning line and a data line connected to the pixel circuit; and the pixel circuit has a one-to-one correspondence with the first electrode, a light emitting structure layer is disposed in the opening of the pixel defining layer to form a plurality of sub-pixels, and the sub-pixel has a one-to-one correspondence with the first electrode, the second electrode is a surface electrode, the scanning line controls the turning on and turning off of the pixel circuit, and when the pixel circuit is turned on, the data line provides a drive current for the first electrode to control illumination of the sub-pixels.

In the above display panel, the scanning line controls the turning on and off of the pixel circuit, which requires only a switching voltage required by the pixel circuit, thereby greatly reducing a load current of the scanning line. When the pixel circuit is turned on, the data line provides the driving current for the first electrode to control light emission of the sub-pixel. The data line only needs to supply the driving current for one sub-pixel at each time, so that the data line has a very small load. A plurality of sub-pixels share the surface electrode and the currents of one row of sub-pixels are provided by the full-surface of the second electrode at each time, so that the conductivity requirements for the second electrode are greatly reduced, and electrodes with high transparency can be used to increase transparency and improve the overall consistency of the screen.

BRIEF DESCRIPTION OF THE DRAWINGS

In order to more clearly illustrate the embodiments of the present application or the technical solutions in the prior art, the drawings used in the embodiments or the description of the prior art will be briefly described below. Obviously, the drawings attached in the following description only represent some examples of the present application, and those skilled in the art can obtain other drawings based on these drawings without any creative intellectual work.

FIG. 12 is a flow chart showing a specific example of a method of forming a display panel in the Embodiment of the present application;

DETAILED DESCRIPTION OF THE INVENTION

Figure 1:
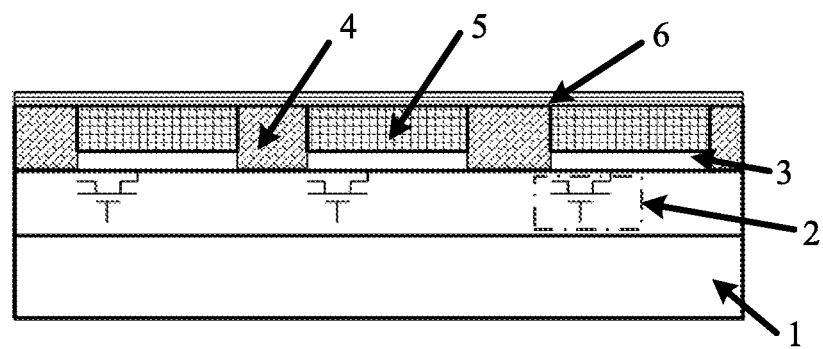
FIG. 1 is a is a sectional view of the display panel in the Embodiment of the present application.

In order to make the objects, technical solutions and advantages of the application more clear, the present application will be further described in detail below with reference to the drawings and examples. It should be understood that the embodiments described herein are merely illustrative of the application and are not intended to limit the scope of the present application.

In the description of the present application, it should be understood that the terms "center", "transverse", "upper", "lower", "left", "right", "vertical", "horizontal", "top", "bottom", "inside" and "outside" indicate orientation or positional relationship which are based on the orientation or positional relationship shown in the drawings, and it is merely for convenience of describing the present application and simplifying the description, rather than indicating or implying that the indicated device or element must have a particular orientation, and be constructed and operated in a particular orientation. Therefore these terms should not be understood as limiting the scope of the present application. In addition, it should be noted that when an element is referred to as "formed on another element", the element can be directly connected to the other element or a middle element may be present at the same time. When an element is considered to be "connected" to another element, it can be directly connected to the other element, or a middle element may be present at the same time. In contrast, when an element is referred to as being "directly on" another element, there is no middle element.

In order to achieve a full screen display, the display screen needs to achieve a certain level of transparency to meet the transparency requirements of the camera, etc. When the transparent screen is a PMOLED screen, indium tin oxide (ITO) is used in the wiring of the cathode and anode of the Organic Light Emitting Diode (OLED), which can significantly improve the transparency of the screen. However, the electrode resistance of ITO is much larger than the electrode resistance of Ag or MgAg, at the same time, in the PM driving mode, the wiring in a row direction need to withstand the current of the entire row of pixel of the OLEDs, and an instant pixel current of each OLED is much higher than that of the AM OLED, and the ITO electrode with high-resistance cannot withstand such a large current; cathode made of Ag or MgAg has an increased current carrying capacity, but the transparency of the cathode can be significantly reduced. When the transparent screen is an AMOLED screen, a large number of transistors are required to drive the OLED which makes a complicated metal wiring, and the metal wiring seriously influences the transparency.

Based on this, the present application provides a display panel having a high level of transparency to solve the above problems.

FIG. 1 is a sectional view of the display panel in an example, as shown in FIG. 1, the display panel comprises a substrate 1 and a pixel circuit 2 disposed on the substrate 1; the pixel circuit 2 is provided with a first electrode layer. The first electrode layer comprises a plurality of first electrodes 3, and the first electrodes 3 have a one-to-one correspondence with the pixel circuits 2, and the first electrode is an anode and the first electrode layer is an anode layer. The display panel further comprises the pixel defining layer 4 disposed on the first electrode 3. The pixel defining layer 4 has a plurality of openings and the light emitting structure layers 5 are disposed in the openings to form a plurality of sub-pixels. The sub-pixels have a one-to-one correspondence with the first electrodes 3. A second electrode 6 is disposed above the light-emitting structure layer 5, and the second electrode 6 is a cathode which is a surface electrode, that is, a full-surface electrode made of a whole surface electrode material. A scanning line and a data line are both connected to the pixel circuit 2, and the scanning line controls the turning on and turning off of the pixel circuit 2. When the pixel circuit 2 is turned on, the data line provides a drive current for the first electrode 3 to control illumination of the sub-pixel.

In the above display panel, the scanning line controls the turning on and off of the pixel circuit, which requires only a switching voltage required by the pixel circuit, thereby greatly reducing the load current of the scanning line. When the pixel circuit is turned on, the data line provides a driving current for the anode to control light emission of the sub-pixel. The data line only needs to supply the driving current for one sub-pixel at each time, so that the data line has a very small load. A plurality of sub-pixels share the surface electrode (cathode) and the currents of one row of sub-pixels are provided by the full-surface cathode at each time, so that the conductivity requirements for the cathode are greatly reduced, and electrodes with high transparency can be used to increase transparency and improve the overall consistency of the screen.

In an example which is substantially same as the above example excepting that the substrate 1 may be a rigid substrate, such as a transparent substrate comprising a glass substrate, a quartz substrate, or a plastic substrate and the like; the substrate 1 may also be a flexible substrate, such as a PI film, to improve the transparency of the device.

In an example which is substantially same as the above example excepting that the light emitting structure layer may be an Organic Light-Emitting Diode (OLED).

Figure 2:
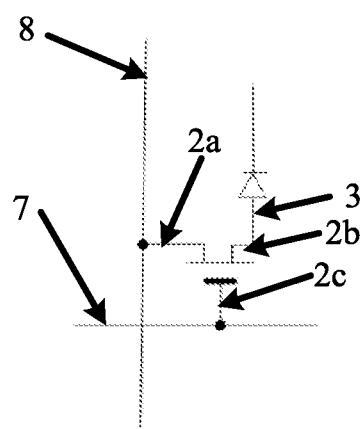
FIG. 2 is a schematic view showing a pixel circuit of a display panel in the Embodiment of the present application.

In an alternative example which is substantially same as the above examples excepting that the pixel circuit 2 comprises at least one switching device, and the switching device comprises a first terminal 2a, a second terminal 2b and a control terminal 2c, as described in detail below. A scanning line 7 is connected to the control terminal 2c of the switching device, a data line 8 is connected to the first terminal 2a of the switching device, and a first electrode 3 is connected to the second terminal 2b of the switching device. As shown in FIG. 2, the pixel circuit 2 includes one switching device and the switching device has a one-to-one correspondence with the first electrode 3, the data line 8 is connected to the first terminal 2a of the switching device, the scanning line 7 is connected to the control terminal 2c of the switching device, and a plurality of sub-pixels have a one-to-one correspondence with a plurality of switching devices, that is one sub-pixel corresponds to one switching device. The data line is connected to the first terminal of the switching device, and the scanning line is connected to the control terminal of the switching device and the number of the switching devices in the pixel circuit is reduced to one, which greatly reduces the load currents of the scanning line and the data line.

In an alternative embodiment which is substantially same as the above examples excepting that the pixel circuit may also comprise two or even more switching devices, and may further comprise a capacitive element, and a plurality of switching devices can be connected in series or in parallel as required, such as pixel circuits 2T1C, 7T1C, etc. which is not limited in this embodiment. For example, the pixel circuit comprises two switching devices (a first switching device and a second switching device); when the two switching devices are connected in series, the control terminal of the first switching device and the control terminal of the second switching device are connected to each other and then connected with a scanning line. A first terminal of the first switching device is connected to the data line, a second terminal of the first switching device is connected to the first terminal of the second switching device, and a second terminal of the second switching device is connected to the first electrode. When the two switching devices are connected in parallel, the control terminal of the first switching device and the control terminal of the second switching device are connected to each other and then connected to the scanning line. The first terminal of the first switching device and the first terminal of the second switching device are connected to each other and then connected to the data line, and the second terminal of the first switching device and the second terminal of the second switching device are connected to each other and then connected to the first electrode.

In an alternative example which is substantially same as the above examples excepting that when the pixel circuit comprises one switching device, the switching device is a driving TFT, the first terminal 2a is a source 21 of the driving TFT, the second terminal 2b is a drain 22 of the driving TFT, and a control terminal 2c is a gate 23 of the driving TFT; the driving TFT has a top gate structure or a bottom gate structure. In the actual manufacturing process, the source 21 and the drain 22 of the TFT have the same structure and can be exchanged. In this example, a source of the thin film transistor can be used as the first terminal and a drain of the thin film transistor can be used as the second terminal for convenience of description. Certainly, in other examples, a drain of the thin film transistor can be used as the first terminal, and a source of the thin film transistor can be used as the second terminal. In another alternative example, the switching device can also be a Metal-Oxide-Semiconductor Field-Effect Transistor (MOSFET), and may also be other elements that conventionally have switching characteristics, such as insulated gate bipolar transistor (IGBT) etc., the electronic elements capable of realizing the switching function in the present example and being integrated into the display panel fall within the scope of the present application.

In an alternative example which is substantially same as the above examples excepting that the thin film transistor may be an oxide thin film transistor or a low temperature polycrystalline silicon thin film transistor (LTPS TFT). Preferably, the thin film transistor is an indium gallium zinc oxide thin film transistor (IGZO TFT)). The low temperature polycrystalline silicon thin film transistor has the following advantages of high electron mobility, high resolution, simple design and better display effect; the oxide thin film transistor has the following advantages of high optical transmittance, mature process and simple manufacturing technology.

Figure 3:
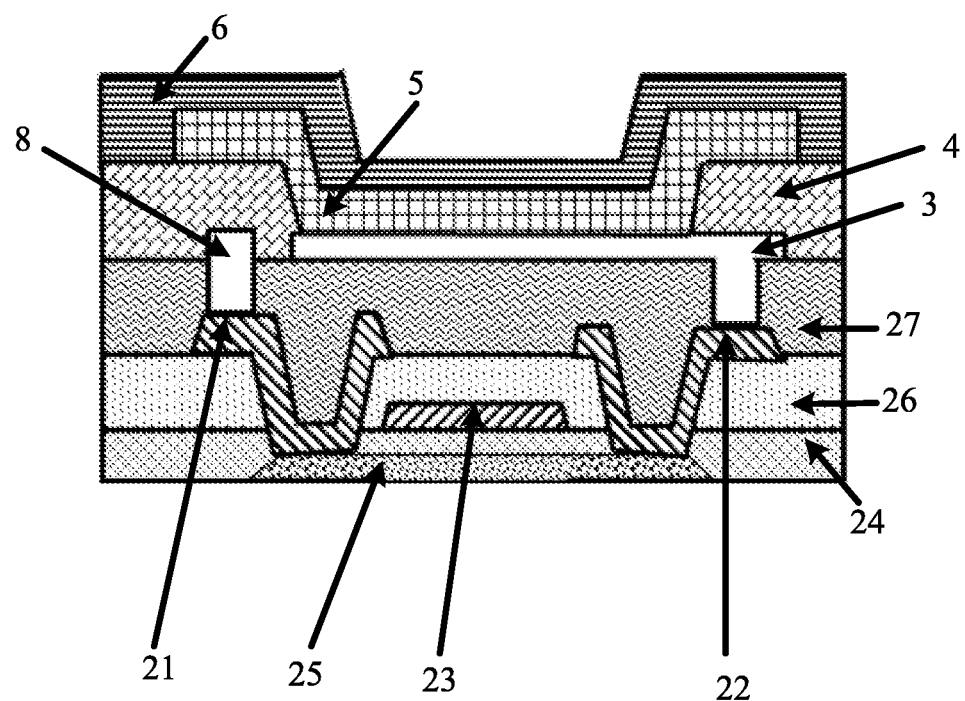
FIG. 3 is a schematic view showing another specific example of a display panel, the thin film transistor of which is configured as a top gate structure, in the Embodiment of the present application.

In an alternative example which is substantially same as the above examples excepting that when the thin film transistor is configured as a top gate structure, as shown in FIG. 3, the thin film transistor comprises an active layer 25, a gate insulating layer 24 disposed on the active layer 25, and a gate 23 disposed on the gate insulating layer 24 and connected to the scanning line; an interlayer insulating layer 26 disposed on the gate 23; a source 21 and a drain 22 disposed on the interlayer insulating layer 26. The above active layer, the gate insulating layer, the gate layer, the interlayer insulating layer, the source and the drain constitute a switching device TFT, and a planarization layer 27 is arranged on the source 21 and the drain 22. The source 21 is connected to the data line 8 through a through-hole in the planarization layer 27, and the drain 22 is connected to the first electrode 3 through a through-hole in the planarization layer 27. The number of photolithographic masks required for the TFT of the top gate structure is small, the manufacturing process is simple, and the cost is low.

Figure 4:
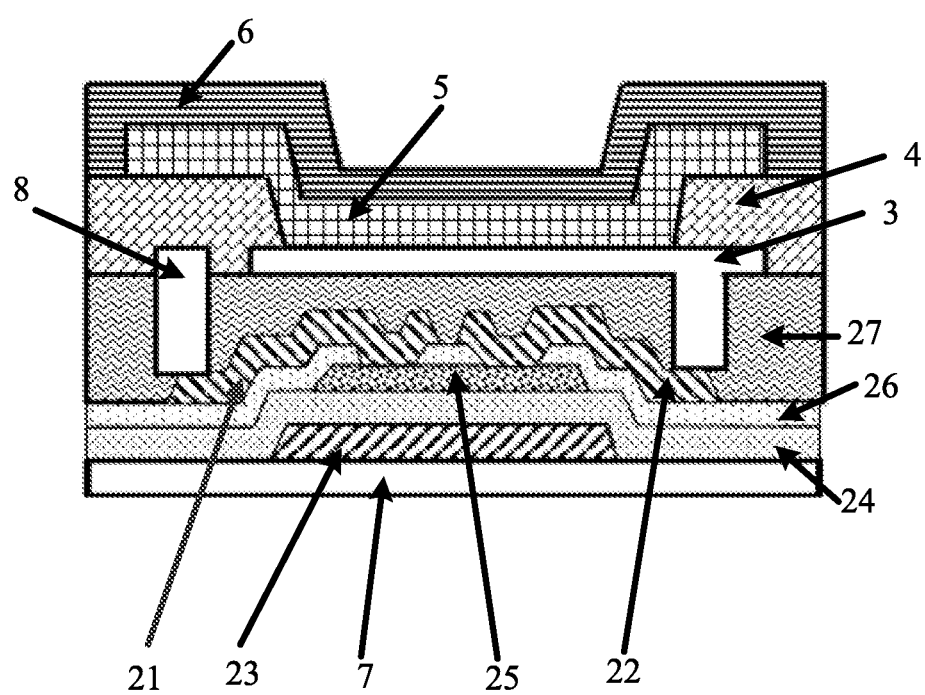
FIG. 4 is a schematic view showing another specific example of a display panel, the thin film transistor of which is configured as a bottom gate structure, in the Embodiment of the present application.

In an alternative example which is substantially same as the above examples excepting that when the thin film transistor is configured as a bottom gate structure, as shown in FIG. 4, the thin film transistor comprises a gate 23 disposed on a scanning line 7 and connected to the scanning line 7; a gate insulating layer 24, an active layer 25, and an interlayer insulating layer 26 which are sequentially stacked on the gate 23; a source 21 and a drain 22 which are disposed on the interlayer insulating layer 26; and a planarization layer 27 disposed on the source 21 and the drain 22. The source 21 is connected to the data line 8 through a through-hole in the planarization layer 27, and the drain 22 is connected to the first electrode 3 through a through-hole in the planarization layer 27. The manufacturing process of the bottom gate structure is complicated, and the gate and the gate insulating layer of the TFT can be used as optical protective film with good optical characteristics.

Figure 14:
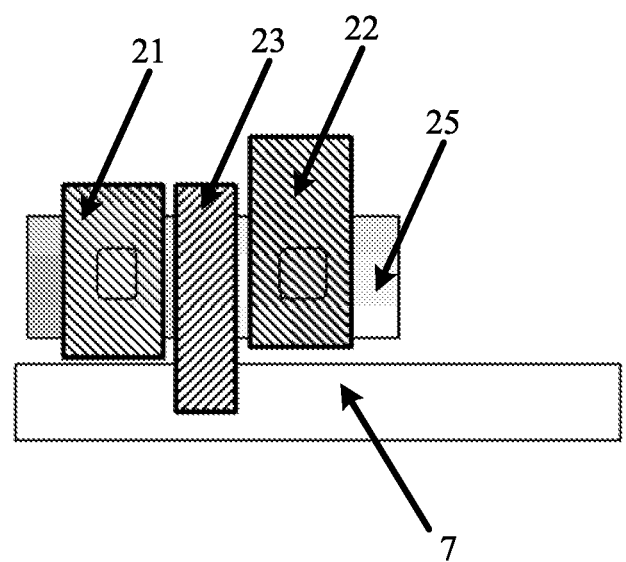
FIG. 14 is a schematic structural view showing a specific example of a switching device, the gate is formed after the scanning line is formed, in the Embodiment of the present application.
Figure 15:
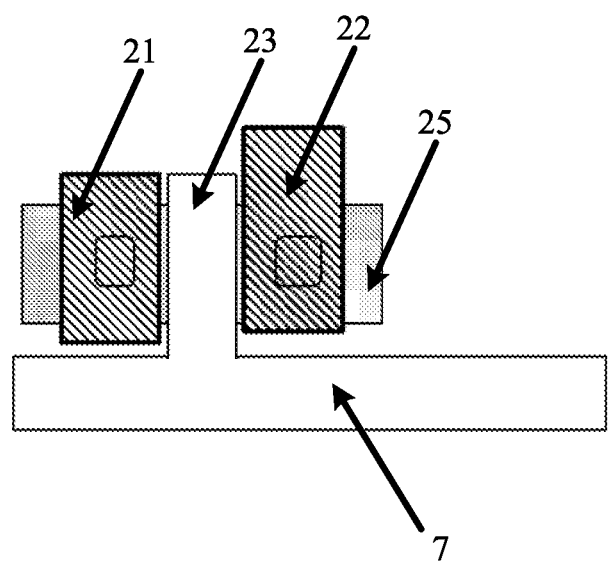
FIG. 15 is a schematic structural view showing another specific example of the switching device, the scanning line and the gate are formed simultaneously, in the Embodiment of the present application.

The scanning line is connected to the gate. In order to simplify the processing step and save the technical process, the scanning line and the gate are formed in the same processing step, that is, the scanning line and the gate are arranged in the same layer. Optionally, specifically, the scanning line and the gate can be made of ITO material, and then an ITO layer may be manufactured firstly in the manufacturing process, and then the ITO can be patterned by a first mask and the scanning line and the gate can be formed at the same time, as shown in FIG. 15. Optionally, the scanning line can also be disposed above or below the gate such that the gate and scanning line need to be formed separately, as shown in FIG. 14.

In order to simplify the processing step and save technical process, the data line and the first electrode can be formed in the same processing step, in other words, the data line and the first electrode are arranged in the same layer. Optionally, the data line and the first electrode are both made of ITO material to manufacture a full-surface of ITO, and the ITO can be patterned through a second mask and the data line and the first electrode can be formed at the same time. Optionally, when the data line and the first electrode are made of different materials, the data line and the first electrode may also be formed separately.

In an alternative example which is substantially same as the above examples excepting that in order to maximize the overall transparency of the display panel, the first electrode, the second electrode, the data line, and the scanning line are all made of a transparent conductive material with a transmittance of more than 90%. Therefore, the entire display panel has a transmittance of more than 70%, and the display panel has a higher transparency.

Since the ITO process is mature and low in cost, preferably the conductive material is indium zinc oxide. Further, in order to reduce resistance of each conductive wiring on the basis of ensuring high light transmittance, the transparent conductive material can be aluminum-doped zinc oxide, silver-doped ITO or silver-doped IZO.

In other alternative examples which are substantially same as the above examples excepting that the transparent conductive material may be other conventional materials, which may be appropriately chosen according to actual needs, which is not limited in this example. Optionally, at least one of the first electrode, the second electrode, the data line, and the scanning line can be made of a transparent conductive material.

A plurality of scanning lines extend in parallel along a first direction, a plurality of data lines extend in parallel along a second direction, the first direction intersects with the second direction, and at least one side of the scanning line and/or the data line in the extending direction thereof has a wave shape. Optionally, the scanning line extends in the X direction, the data line extends in the Y direction, and the projections of the data line and the scanning line on the substrate are perpendicular to each other, and both sides of the scanning line in the extending direction have a wave shape, and both sides of the data line in the extending direction thereof also have a wave shape. The data lines and the scanning lines that have a wave shape can generate diffraction fringes having different positions and diffusion directions, thereby weakening the diffraction effect, and further ensuring that the image obtained by the camera has a higher definition when the camera is disposed below the display panel.

Figure 5:
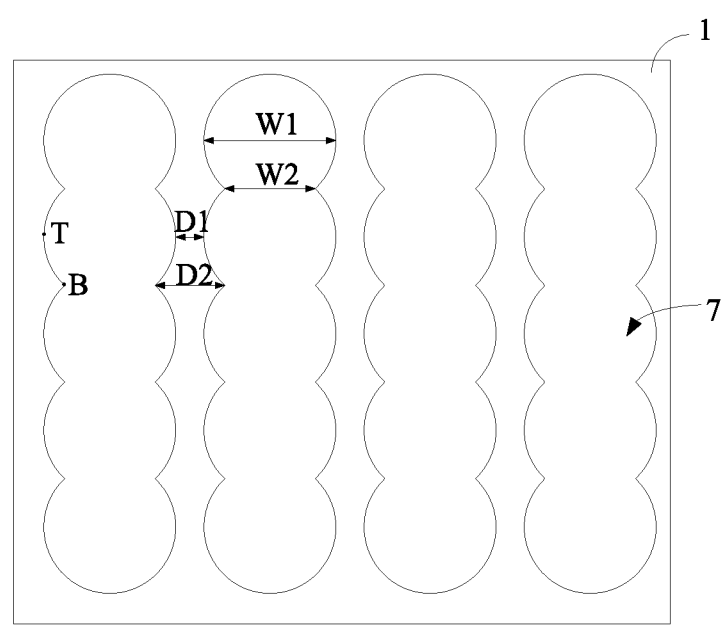
FIG. 5 is a schematic view of a specific example of a scanning line of a display panel in the Embodiment of the present application.

In an alternative example which is substantially same as the above examples excepting that since the scanning lines have a wave shape, and adjacent scanning lines have a first pitch, and the first pitch changes continuously or intermittently; a width of the scanning lines changes continuously or intermittently. Continuous change in width means that the widths between two adjacent positions on the scanning line are different. In FIG. 5, the direction in which the scanning line extends is its lengthwise direction. The scanning lines continuously change in width in the extending direction. The width changes intermittently means that the widths of two adjacent positions in a partial area on the scanning line are same, while the widths of the two adjacent positions in another partial area are different. In the present example, a plurality of scanning lines are regularly arranged on the substrate, and therefore, the pitch between the adjacent two scanning lines also exhibits a continuous change or intermittent changes in a direction parallel to the extending direction of the scanning lines. The scanning lines can be periodically changed in the extending direction regardless of whether the width is continuously changed or intermittently changed.

Figure 6:
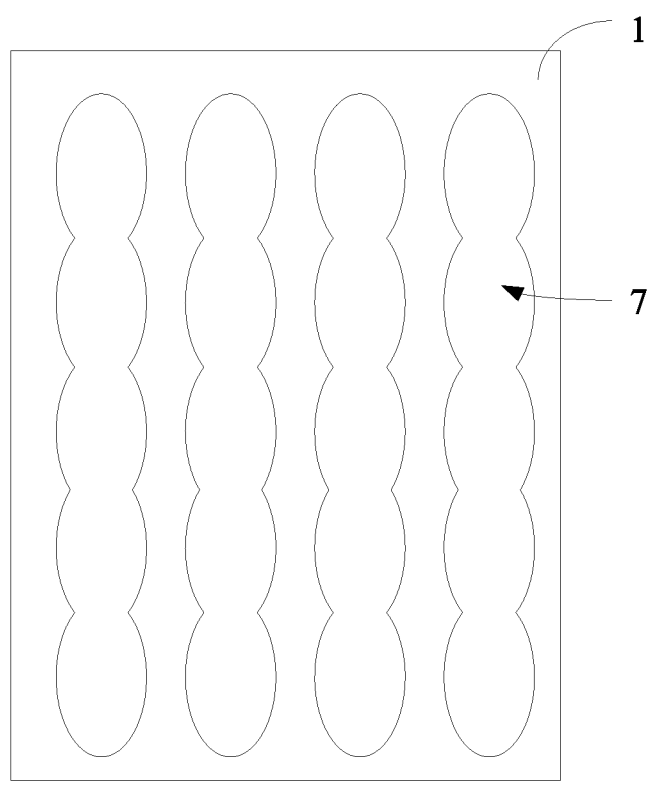
FIG. 6 is a schematic view showing another specific example of a scanning line with different shape from that of the scanning line of FIG. 5.

Both sides of the scanning line in the extending direction have a wave shape, and wave peaks of the two sides are oppositely disposed, and wave troughs are oppositely disposed. As shown in FIG. 5, the wave peaks T of the two sides in the extending direction are oppositely disposed and the wave troughs B are oppositely disposed. The width between the peaks of the same scanning line is W1, and the width between the wave troughs of the same scanning line is W2. The pitch between the peaks of adjacent two scanning lines is D1, and the pitch between the troughs of adjacent two scanning lines is D2. In this example, both sides are connected by the same arc-shaped side. In other examples, the two sides may also be connected by the same elliptical side, as shown in FIG. 6. By setting the two sides of the scanning lines into a wave shape formed by a circular arc shape or an elliptical shape, it can be ensured that the diffraction fringes generated by the scanning lines can be spread in different directions, thereby not causing a more significant diffraction effect.

Figure 7:
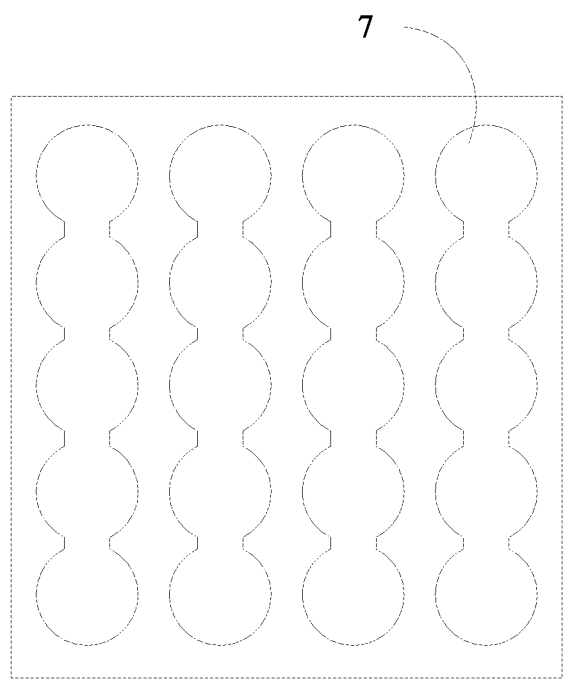
FIG. 7 is a schematic view showing another specific example of a scanning line of a display panel in the Embodiment of the present application, a first connecting portion is formed at a corresponding position of the wave troughs of the scanning line.

In an alternative example which is substantially same as the above examples excepting that a first connecting portion is formed at a corresponding position of the wave troughs of a wavy scanning line, and the first connecting portion may be a straight line or a curve. As shown in FIG. 7, the first connecting portion is strip-shaped, and the first connecting portion is an electrical connecting area between the scanning line and the switching device, that electrical connecting area is a position where the control terminal of the switching device is connected to the first connecting portion. Optionally, the connecting portion may also have other irregular structures, such as a shape which is large at both ends and small in the middle, or a shape which is small at both ends and large in the middle.

In an alternative example which is substantially same as the above examples excepting that since the data lines has a wave shape, adjacent data lines have a second pitch, and the second pitch changes continuously or intermittently; and the width of the data lines changes continuously or intermittently. The data line is similar to the scanning line, the detailed description of the data line can be found in related parts, which are not described here. The data line can have any of the wave shapes in FIGS. 5-7. The two sides of the data lines in the extending direction have a wave shape, and the wave peaks of the two sides are oppositely disposed, and the wave troughs are oppositely disposed. A second connecting portion is formed on a corresponding position of the troughs of the data lines, and the second connecting portion is an electrical connecting area of the data line and the switching device. The setting of the data line is similar to that of the scanning line and the details can be found in the setting of the scanning lines.

The scanning lines and data lines on the display panel have any one of the wave shapes as shown in FIG. 5-7 to ensure that the light can form diffraction fringes having different positions when passing through positions with different widths and different pitches of adjacent wirings in the extending direction of the data lines and the scanning lines, thereby diminishing the diffraction effect, so that the photosensitive device arranged below the display panel can work normally.

Figure 8:
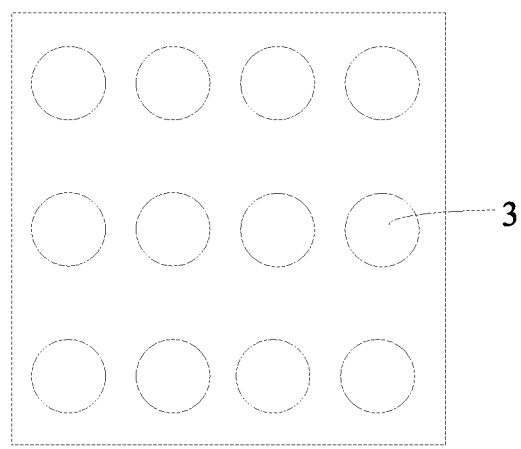
FIG. 8 is a schematic view of a specific example of a first electrode of a display panel in the Embodiment of the present application.
Figure 9:
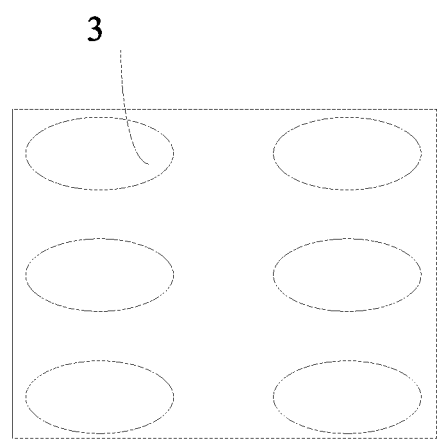
FIG. 9 is a schematic view showing another specific example of a first electrode of a display panel with different shape from that of the first electrode of FIG. 8.
Figure 10:
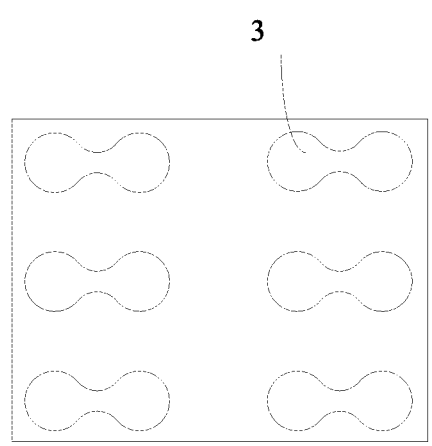
FIG. 10 is a schematic view showing another specific example of a first electrode of a display panel with different shape from that of the first electrode of FIG. 8.

In an alternative example which is substantially same as the above examples excepting that the first electrode can have a shape such as a circular shape as shown in FIG. 8, or an elliptical shape as shown in FIG. 9, or a dumbbell shape as shown in FIG. 10. The first electrode can also be composed of curves having different curvature radius at different positions. Since light passes through obstacles such as slit, small hole, or disc, the light will be bent with different degrees, the light will be deviated from the original linear direction. This phenomenon is called as diffraction. During the diffraction process, the distribution of the diffraction fringes can be affected by the size of the obstacle, such as a width of the slit, a size of the small hole, etc., and the positions of the diffraction fringes generated at the positions having the same width are uniform, so that a relatively obvious diffraction effect occurs. By changing the shape of the anode into a circular shape, an elliptical shape or a dumbbell shape, it is ensured that when light passes through the anode layer, diffraction fringes having different positions and diffusion directions can be generated at positions with different widths in the anode, thereby weakening the diffraction effect, and further ensuring the images obtained by a camera have a higher definition when camera is disposed below the display panel.

The sides of the projection of the pixel defining layer on the substrate are not parallel to each other and each side is curved, that is, the opening has a varying width in each direction and has different diffraction diffusion directions at the same position. When external light passes the opening, diffraction fringes having different positions and diffusion directions can be generated at positions with different widths, thereby avoiding significant diffraction effect, and further ensuring that the photosensitive element arranged below the display panel can be operated normally.

The openings on the conventional pixel defining layer are all configured as a rectangle or a square according to the size of the pixel. Taking a rectangular opening as an example, since the rectangle has two sets of parallel sides, the rectangle has the same width in both the length and width directions. Therefore, when external light passes through the opening, diffraction fringes having the same positions and uniform spread directions are generated at different positions in the longitudinal direction or the width direction, so that a significant diffraction effect occurs, and the photosensitive element located below the display panel cannot work normally. The display panel in this example solves the problem well ensuring that the photosensitive element below the display panel can work normally.

In an alternative example which is substantially same as the above examples excepting that the each side of the projection of the openings on the substrate has a curved shape selected from at least one of a circle, an ellipse, and other curves having varying curvatures. All the sides of the opening are curved, therefore, when the light passes through the opening, the generated diffraction fringes do not spread in one direction, but spread toward directions in 360°, so that the diffraction is not obvious, and the improved diffraction effect is better.

In an alternative example which is substantially same as the above examples excepting that the projection graphic unit of the opening on the substrate is circular, elliptical or dumbbell shaped or wave-shape, which is similar to the shape of the first electrode, and the detailed description can be found in the description of first electrode and FIGS. 8-10, which will not be repeated here. The shape of the projection of the opening on the substrate can be determined according to the shape of the corresponding light emitting structure. For example, the number can be determined according to the aspect ratio of the light emitting structure. In an example, the shape of projection of the opening on the substrate may also be an axisymmetric structure, thereby ensuring that each pixel on the entire display panel has a uniform aperture ratio without affecting the final display effect. As shown in FIG. 8, when the projection on the substrate is a circle, the corresponding light-emitting structure has a shape of a rectangle or a square having an aspect ratio of less than 1.5, and the symmetry axis of the projection of the opening corresponds to the symmetry axis of the corresponding light-emitting structure. The circle diameter of the projection is smaller than the minimum width of the light emitting structure. Specifically, the circle diameter of the projection can be determined according to the shape of the light emitting structure in combination with the aperture ratio. Since the determination process can be performed by a conventional method of determining the size of the opening, the detailed description will not be repeated here.

The aspect ratio of the sub-pixel corresponding to the opening is between 1.5 and 2.5. At this time, the projection has a dumbbell shape formed by two circles communicated with each other. The two circles are respectively arranged along the length direction of the corresponding light emitting structures. In one of the examples, there is a connecting portion between the two circles, and both sides of the connecting portion are curved, and when the light passes through the connecting portion, it can also spread in various directions, thereby improving the diffraction effect.

The aspect ratio of the light-emitting structure corresponding to the opening is greater than 2.5. At this time, the projection has a wave shape formed by three or more circles communicated with each other. The three or more circles are respectively arranged along the length direction of the corresponding light emitting structures. In an example, a connecting portion is also formed in the projection. The connecting portion is an arc, that is, three or more circular is connected by an arc, thereby ensuring that light can spread in various directions when passing through the connecting portion, thereby improving the diffraction effect.

Figure 11:
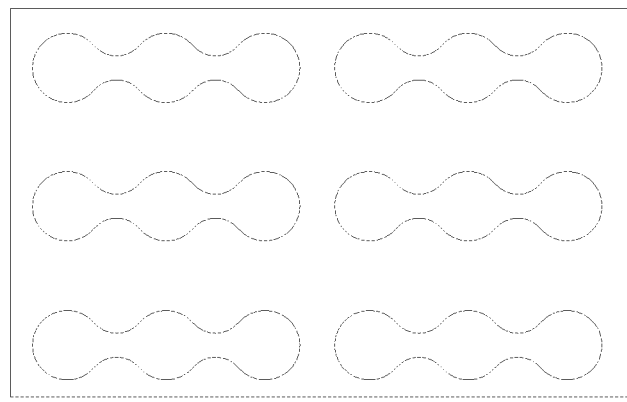
FIG. 11 is a flow chart showing a specific example of an opening of a pixel defining layer of a display panel in the Embodiment of the present application.

When the aspect ratio of the light-emitting structure corresponding to the opening is 1.5, the projection has a circle shape or a dumbbell shape formed by two circles communicated with each other. When the aspect ratio of the light-emitting structure corresponding to the opening is 2.5, the projection has a dumbbell shape formed by two circles communicated with each other, or has a wave shape formed by three circles communicated with each other, as shown in FIG. 11.

In an alternative example as shown in FIGS. 8-10, which is substantially same as the above examples excepting that, the shape of the sub-pixel is the same as the shape of the opening described above, i.e., the sub-pixel has a circle shape, an elliptical shape or a dumbbell shape. Furthermore, the shape design rule of the anode can also refer to the shape design rule of the above opening, thereby further improving the diffraction effect. Certainly, the anode can also be designed in a conventional rectangular shape.

The scanning line of the above display panel is connected to the control terminal of the switching device, and the scanning line only needs to supply the switching voltage for the switching device, and does not need to supply a driving current flowing through the light emitting device, which greatly reduces the load current of the scanning line. The data line is connected to the first terminal of the switching device, and the data line only needs to supply the driving current for one sub-pixel at each moment, so the load of the data line is also small. Since the load of the data line and the scanning line are very small, the data line and the scanning line can be made of a transparent material (such as ITO) which significantly improves the transparency of the display panel. The cathode has a full-surface structure, and no negative photoresist is required to separate the cathode, the current of one row of the OLEDs is provided by the full-surface cathode at each moment, so the conductivity requirement for the cathode is greatly reduced, therefore cathode with better transparency can be used to improve the transparency. The contradiction between wiring of the transparent OLED screen as well as cathode resistance and the transparency is well solved by the above technical process, and the technical process can be compatible with the manufacturing process of conventional display screen.

The embodiment further provides a method for manufacturing a display panel. As shown in FIG. 12, the method comprises the following steps:

Step S1: a plurality of switching devices, scanning lines and data lines are formed; each of the switching devices comprises a first terminal, a second terminal, and a control terminal, respectively, the data line is connected to the first terminal of the switching device, and the scanning line is connected to the control terminal of the switching device.

Figure 13:
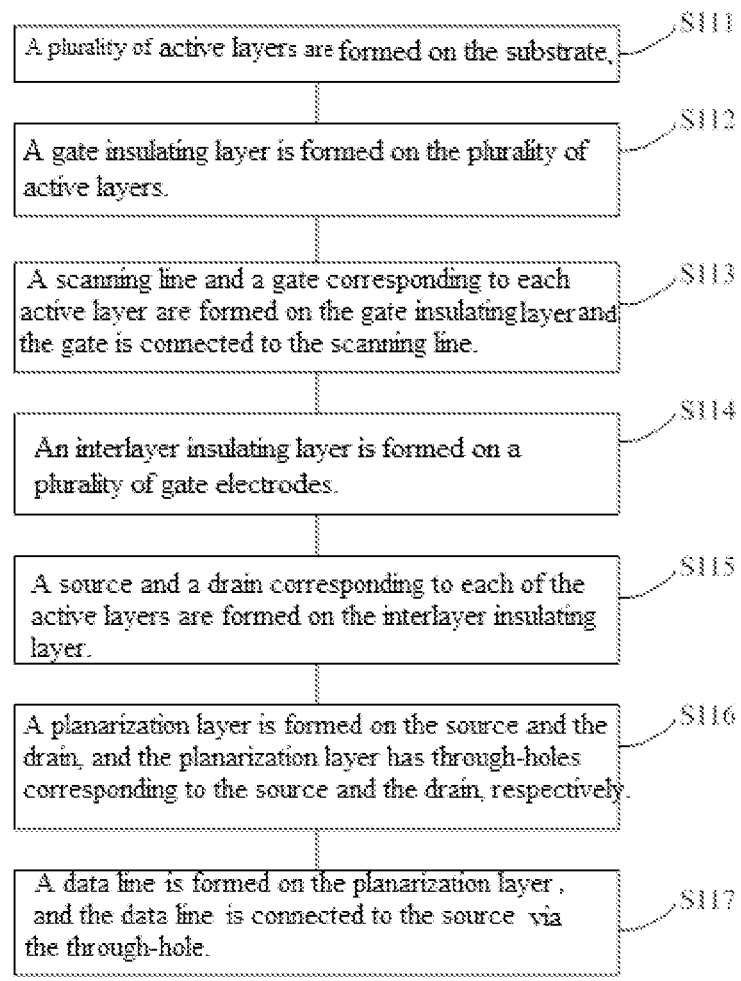
FIG. 13 is a flow chart showing a specific example of forming a plurality of switching devices, scanning lines, and data lines on a substrate in a method of forming a display panel in the Embodiment of the present application.

In an alternative example which is substantially same as the above example excepting that when the switching device is a top gate thin film transistor, as shown in FIG. 13, step S1 specifically comprises the following steps S111-S117:

Step S111: a plurality of active layers 25 are formed on the substrate 1.

In an alternative example which is substantially same as the above examples excepting that the substrate 1 may be a rigid substrate, such as transparent substrates comprising a glass substrate, a quartz substrate, or a plastic substrate; the substrate 1 may also be a flexible substrate such as a PI film or the like.

In an alternative example which is substantially same as the above examples excepting that a P—Si layer is formed on the substrate, and the P—Si layer comprises a shielding layer 28 and an active layer 25 which are sequentially stacked due to the technology employed. The shielding layer is used to isolate oxygen, water, and the like and at the same time, it forms a good interface with the active layer. Specifically, an entire surface of the P—Si layer is formed on the substrate, and then a photoresist is coated on the entire surface of the P—Si layer, and exposed using an active layer mask (PSI mask) to form a patterned active layer 25.

In an alternative example which is substantially same as the above examples excepting that the active layer may be made of a polysilicon material to form a polysilicon thin film transistor; and the polycrystalline silicon may be crystallized (e.g., using SPC solid phase crystallization) to produce a crystalline thin film transistor. Optionally, the active layer may also be made of amorphous silicon, which can be appropriately chosen as needed.

Step S112: a gate insulating layer 24 is formed on the plurality of active layers 25. Optionally, the gate insulating layer can be manufactured by a chemical vapor deposition method. Certainly, the gate insulating layer can be manufactured by other conventional methods, which is not limited in this example. The gate insulating layer may be made of silicon oxide or silicon nitride, and may be appropriately chosen as needed.

Step S113: a scanning line 7 and a gate 23 corresponding to each active layer 25 are formed on the gate insulating layer 24. The gate 23 is connected to the scanning line 7. Optionally, the scanning line 7 is made of indium tin oxide (ITO) material, and the gate 23 is made of a metal material, specifically, a full-surface ITO layer is formed on the gate insulating layer 24, and then a patterned scanning line 7 is formed by a mask, after which a metal gate is formed on the gate insulating layer, and the gate is located on the same layer as the scanning line and connected to the scanning line, as shown in FIG. 14. In an alternate example, the scanning line 7 is made of an indium zinc oxide (IZO) material, and may be made of other conventional transparent conductive materials.

In another alternative example, the scanning line 7 and the gate 23 are both made of an indium tin oxide (ITO) material, specifically a full-surface ITO layer is formed on the gate insulating layer 24, and then ITO layer is patterned by a mask and simultaneously the scanning line 7 and the gate 23 are formed. The gate is located in the same layer as the scanning line and connected to the scanning line, and the manufacturing process is simpler and is easier to be performed, as shown in FIG. 15.

In order to reduce the diffraction, the shape of the scanning line may reference the description of display panel in this example, and the details are not described herein again.

Step S114: an interlayer insulating layer 26 is formed on a plurality of gate electrodes 23. Optionally, the interlayer insulating layer can be formed by a chemical vapor deposition method. Certainly, the interlayer insulating layer can be formed by other conventional methods, which is not limited in this example. The interlayer insulating layer may be made of silicon oxide or silicon nitride, which may be appropriately chosen as needed.

Step S115: a source 21 and a drain 22 corresponding to each of the active layers 25 are formed on the interlayer insulating layer 26. The source 21 and the drain 22 described above may be fabricated in any conventional manner.

Step S116: a planarization layer 27 is formed on the source 21 and the drain 22. The planarization layer 27 has through-holes corresponding to the source 21 and the drain 22, respectively. The corresponding source 21 and drain 22 are exposed at the through-holes. The above planarization layer can be manufactured in any conventional manner. Optionally, the through-holes may be formed on the planarization layer by a wet etching process, or by other conventional methods, such as dry etching.

Step S117: a data line 8 is formed on the planarization layer 27. The data line 8 is connected to the source 21 via the through-hole. The above data line 8 can be manufactured in any conventional manner. The data line 8 is made of indium tin oxide (ITO) material, may also be made of indium zinc oxide (IZO) material, and may be made of other conventional transparent conductive materials. In order to reduce the diffraction, the shape of the data line can reference the description of the display panel in this example, and the details will not repeated herein again.

Figure 16:
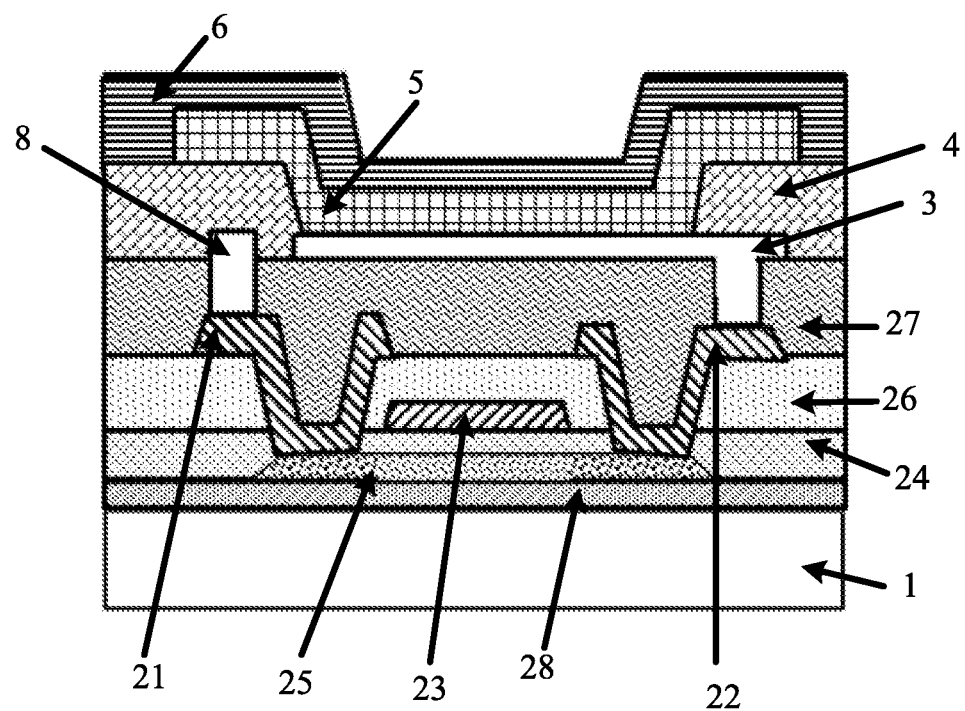
FIG. 16 is a structural view of a specific example of a display panel formed by a method of forming a display panel in the Embodiment of the present application.

A structural view of the display panel manufactured by the above steps is shown in FIG. 16.

Figure 17:
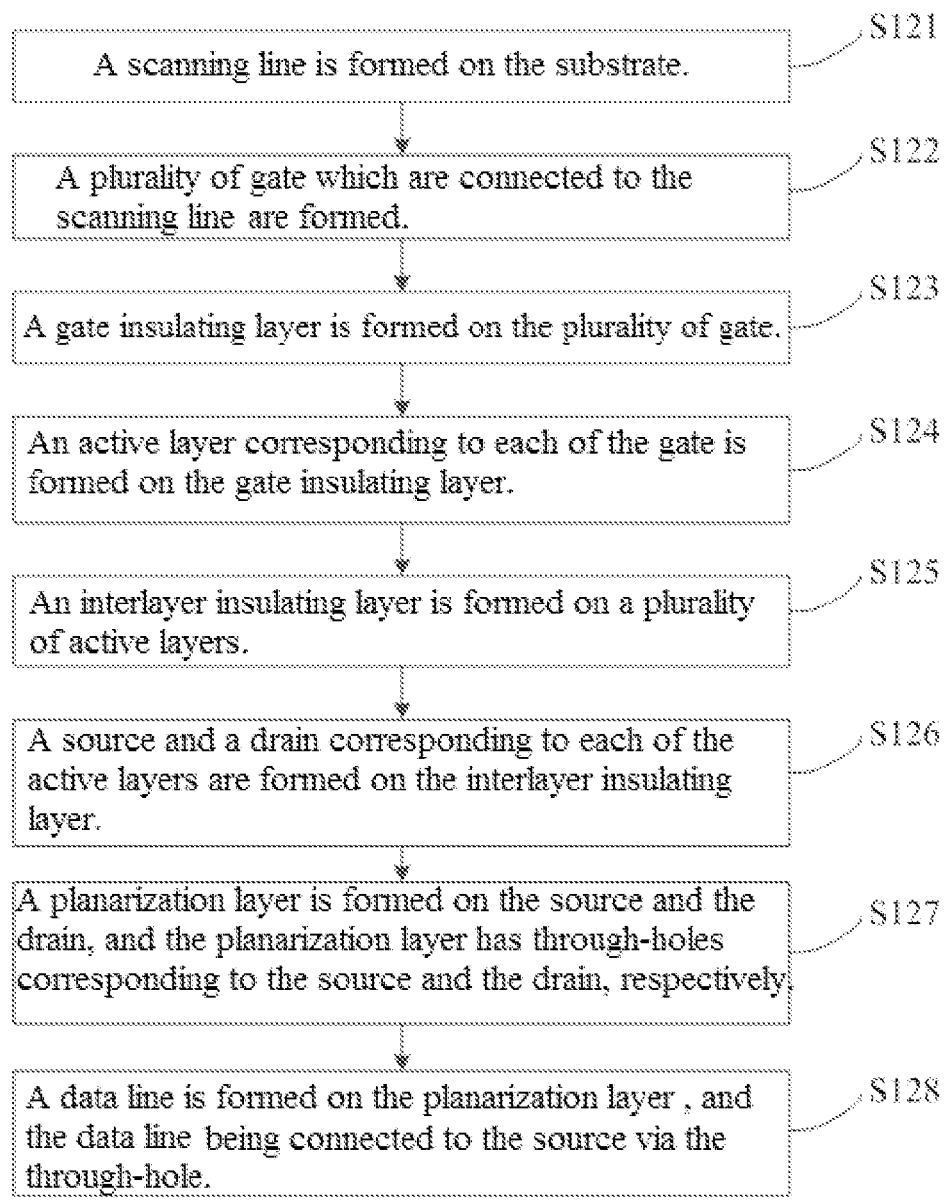
FIG. 17 is a flow chart showing another specific example of forming a plurality of switching devices, scanning lines, and data lines on a substrate in the method of forming a display panel in the Embodiment of the present application.

In an alternative example which is substantially same as the above examples excepting that when the switching device is a bottom gate thin film transistor, as shown in FIG. 17, step S1 specifically comprises the following steps S121-S128:

Step S121: a scanning line 7 is formed on the substrate 1. Optionally, the scanning line 7 is made of an indium tin oxide (ITO) material, specifically a full-surface ITO layer is formed on the substrate, and then a patterned scanning line 7 is formed by a mask.

In an alternative example which is substantially same as the above examples excepting that the substrate 1 may be a rigid substrate, such as a transparent substrate comprising a glass substrate, a quartz substrate, or a plastic substrate; the substrate 1 may also be a flexible substrate such as a PI film or the like.

Step S122: a plurality of gates 23 which are connected to the scanning line 7 are formed. The above gates can be manufactured in any conventional manner.

Step S123: a gate insulating layer 24 is formed on the plurality of gate 23. Optionally, the gate insulating layer can be formed by a chemical vapor deposition method. Certainly, the gate insulating layer can be formed by other conventional methods, which is not limited in this example. The gate insulating layer may be made of silicon oxide or silicon nitride, and may be appropriately chosen as needed.

Step S124: an active layer 25 corresponding to each of the gate 23 is formed on the gate insulating layer 24. The above active layer 25 can be manufactured in any conventional manner. Optionally, the active layer can be made of an oxide material, such as an indium gallium zinc oxide (IGZO) material.

Step S125: an interlayer insulating layer 26 is formed on a plurality of active layers 25. Optionally, the interlayer insulating layer can be manufactured by a chemical vapor deposition method. Certainly, the interlayer insulating layer can be formed by other conventional methods, which is not limited in this example. The interlayer insulating layer may be made of silicon oxide or silicon nitride, and may be appropriately chosen as needed.

Step S126: a source 21 and a drain 22 corresponding to each of the active layers 25 are formed on the interlayer insulating layer 26. The source 21 and the drain 22 described above may be fabricated in any conventional manner.

Step S127: a planarization layer 27 is formed on the source 21 and the drain 22, and the planarization layer 27 has through-holes corresponding to the source 21 and the drain 22, respectively, and the corresponding source 21 and drain 22 are exposed at the through-holes. Optionally, reference may be made to step S116.

Step S128: a data line 8 is formed on the planarization layer 27, and the data line 8 is connected to the source 21 via the through-hole. The above data line 8 can be manufactured in any conventional manner. The data line 8 is made of an indium tin oxide (ITO) material.

Figure 18:
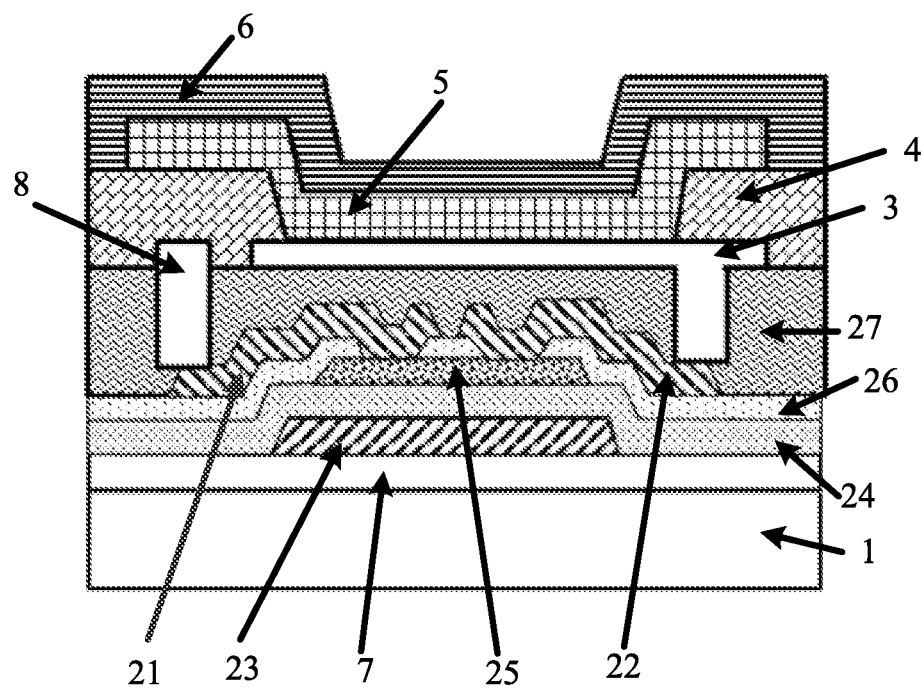
FIG. 18 is a structural view showing another specific example of a display panel formed by the method of forming a display panel in the Embodiment of the present application.

The structural view of the display panel manufactured by the above steps is as shown in FIG. 18.

Step S2: a first electrode 3, a pixel defining layer 4, a light emitting structure layer 5, and a second electrode 6 are correspondingly formed on a plurality of switching devices, the plurality of light emitting structure layers 5 share the second electrode 6, and the first electrodes 3 of the plurality of light emitting structure layers 5 are respectively connected to the second terminal 2b of the switching device.

Figure 19:
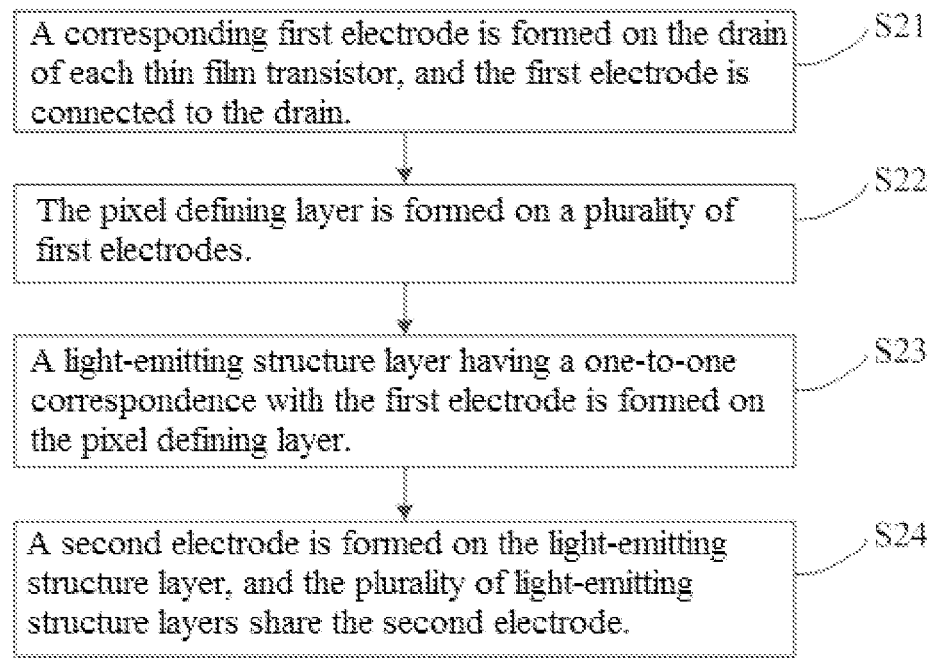
FIG. 19 is a flow chart showing a specific example of forming a plurality of sub-pixels having a one-to-one relationship with a plurality of switching devices on the plurality of switching devices in the method of forming a display panel in the Embodiment of the present application.

In an alternative example, as shown in FIG. 19, which is substantially same as the above examples excepting that step S2 specifically comprises the following steps S21-S24:

Step S21: a corresponding first electrode 3 is formed on the drain 22 of each thin film transistor, and the first electrode 3 is connected to the drain 22. Optionally, specifically, the first electrode 3 is formed on the planarization layer 27, and the first electrode 3 is made of an ITO material, and after the ITO material is filled into the through-hole, the ITO material is connected to the drain 22. Optionally, the data line and the first electrode are located in the same layer and can be manufactured simultaneously, covering the full-surface of the ITO material on the planarization layer 27, and then the patterned data line and the first electrode can be obtained through the mask. The manufacturing process is simple and cost-effective. In order to reduce the diffraction, the shape of the first electrode can reference the display panel in this example, and details are not described herein again.

Step S22: the pixel defining layer 4 is formed on a plurality of first electrodes 3. The pixel defining layer 4 comprises a plurality of openings, each of the openings corresponds to a first electrode, and the first electrode is exposed at the opening. Optionally, the sides of the projection of the opening formed on the pixel defining layer 4 on the substrate are not parallel to each other and the sides are curved, that is, the opening has varying widths in every direction and has different diffraction spreading directions at the same position. When external light passes through the opening, diffraction fringes having different positions and diffusion directions can be generated at positions with different widths, thereby avoiding a significant diffraction effect, and further ensuring the photosensitive element disposed below the display panel can work normally. In order to reduce the diffraction, the shape of the opening projection can reference the description of the display panel in this example, and details are not described herein again.

Step S23: a light-emitting structure layer 5 having a one-to-one correspondence with the first electrode 3 is formed on the pixel defining layer 4. Optionally, specifically, the light-emitting structure layer 5 is formed on the opening, and the light-emitting structure layer 5 can be manufactured in any conventional manner.

Step S24: a second electrode 6 is formed on the light-emitting structure layer 5, and the plurality of light-emitting structure layers 5 share the second electrode 6. Optionally, specifically, the full-surface of the second electrode 6 is formed on the plurality of light emitting structure layers 5 and the pixel defining layer 4. Optionally, the second electrode 6 can be made of an ITO material.

The example further provides a display screen, comprises at least a first display area and a second display area, each display area is used for displaying a dynamic or static picture, and a photosensitive device is disposed below the first display area; and the first display area is provided with the display panel of any of the above examples, and the second display area is provided with a PMOLED display panel or an AMOLED display panel. Since the display panels in the above examples are used in the first display area, the first display area has better transparency and the overall consistency of the display screen is better, and when the light passes through the display area, significant diffraction effect can be avoided, thereby ensuring that the photosensitive device arranged below the first display area can work normally. It can be understood that the first display area can normally display dynamic or static pictures when the photosensitive device is not working, and the first display area is in a non-displaying state when the photosensitive device is working, thereby ensuring that a normal light collection by the photosensitive device can be performed normally through the display panel. The transparency of the first display area is significantly improved, so that contradiction between the wiring of the transparent OLED screen and the cathode resistance with the transparency is well solved, and this design can be compatible with the manufacturing process of the normal display screen, and the production cost is low.

Figure 20:
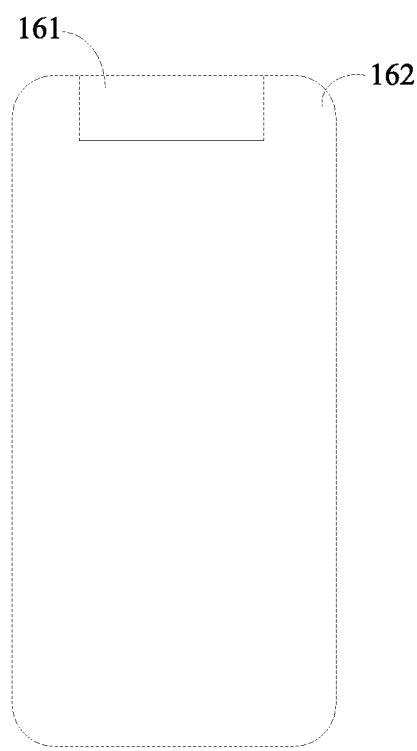
FIG. 20 is a schematic view showing a specific example of a display screen in the Embodiment of the present application.

In an alternative example which is substantially same as the above examples excepting that as shown in FIG. 20, the display screen comprises a first display area 161 and a second display area 162, each of which is used to display a static or dynamic picture, and the display panel mentioned in any of the above Examples is used in the first display area 161, and the first display area 161 is located at the upper portion of the display screen.

In an alternative example which is substantially same as the above examples excepting that the display screen may further comprise three or more display areas, such as three display areas (a first display area, a second display area, and a third display area). The display panel mentioned in any of the above examples is used in the first display area. The display panel used in the second display area and the third display area is not limited in this example, and the display panels may be a PMOLED display panel or an AMOLED display panel, and certainly, the display panel of this example can also be used.

In an alternative example which is substantially same as the above examples excepting that when the display panel in the second display area is an AMOLED display panel, the cathode of the display panel of the first display area and the cathode of the display panel of the second display area share a full-surface electrode. A coplanar cathode makes the fabrication process simple, and the conductivity requirement of the cathode is further reduced. The electrode with better transparency can be used to improve the transparency and improve the overall consistency of the display screen.

The example further provides a display apparatus, comprising the above display screen overlaid on the apparatus body. The display apparatus may be a product or a component having a display function, such as a mobile phone, a tablet PC, a television, a display screen, a palmtop computer, an iPod, a digital camera, a navigator, or the like.

Figure 21:
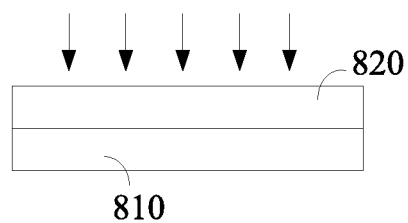
FIG. 21 is a schematic view of a specific example of a display terminal in the Embodiment of the present application.

FIG. 21 shows a schematic structural view of a display terminal in one example, the display terminal comprises an apparatus body 810 and a display screen 820. The display screen 820 is disposed on the apparatus body 810 and is interconnected with the apparatus body 810. The display screen 820 can be the display screen in any of the above examples for displaying a static or dynamic picture.

Figure 22:
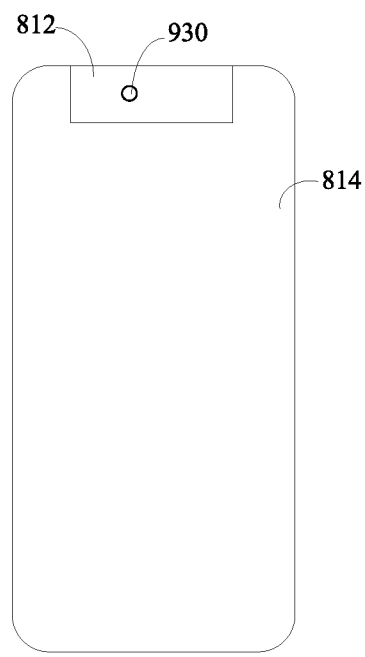
FIG. 22 is a schematic structural view of an apparatus body in the Embodiment of the present application.

FIG. 22 shows a schematic structural view of the apparatus body 810, the apparatus body 810 can be provided with a grooved region 812 and a non-grooved region 814. A photosensitive device such as a camera 930 and an optical sensor, a light sensor, or the like may be disposed in the grooved region 812. At this time, the display panel of the first display area of the display screen 820 is attached to the grooved region 812 so that the above-mentioned photosensitive device such as the camera 930 and the optical sensor can collect external light through the first display area. Since the display panel in the first display area can effectively improve the diffraction phenomenon generated by the external light passing through the first display area, thereby effectively improving the quality of the image captured by the camera 930 on the display apparatus, and avoiding the image distortion of the image captured due to diffraction, while also improving the accuracy and sensitivity of the light sensor for sensing external light.

Figure 23:
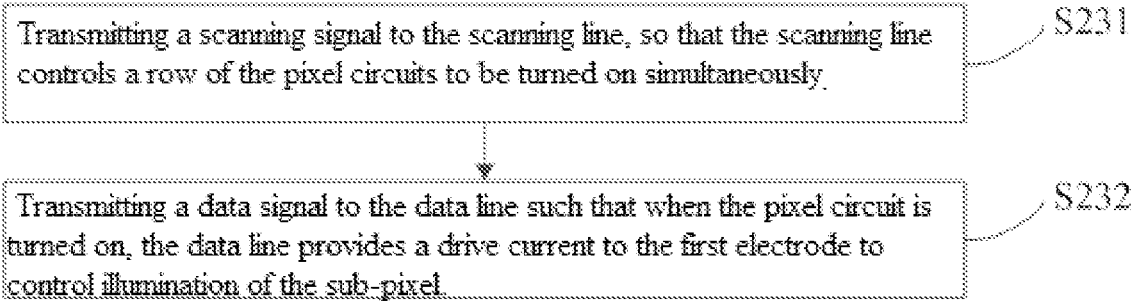
FIG. 23 is a schematic structural view of a specific example of the method of driving a display panel in the Embodiment of the present application.

The example further provides a method for driving the display panel in any one of the above examples, and the method is used to drive IC to control the displaying of the display panel, as shown in FIG. 23, and the method comprises the following steps S231 and S232:

Step S231: transmitting a scanning signal to the scanning line, so that the scanning line controls a row of the pixel circuits to be turned on simultaneously;

Step S232: transmitting a data signal to the data line such that when the pixel circuit is turned on, the data line provides a drive current for the first electrode to control illumination of the sub-pixel.

In an alternative example which is substantially same as the above examples excepting that a luminance brightness of the sub-pixel is controlled by controlling a pulse width of the data line. The driving current of the sub-pixel is adjusted by controlling the pulse width, the larger the driving current is, the brighter the luminance of the sub-pixel is.

Figure 24:
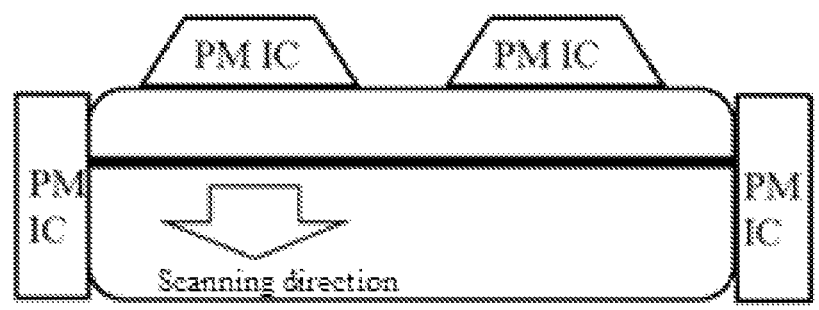
FIG. 24 is a schematic structural view of a specific example of a driving chip in the method of driving a display panel in the Embodiment of the present application.

In an alternative example, as shown in FIG. 24, which is substantially same as the above examples excepting that the scanning signal and the data signal are transmitted to the scanning line and the data line through a driving chip, and the driving chip may be a PMOLED driving chip (PM IC), and the data signal and the scanning signal are both provided by the PM IC, and the cost is reduced by sharing one IC without additional driving chips.

Figure 25:
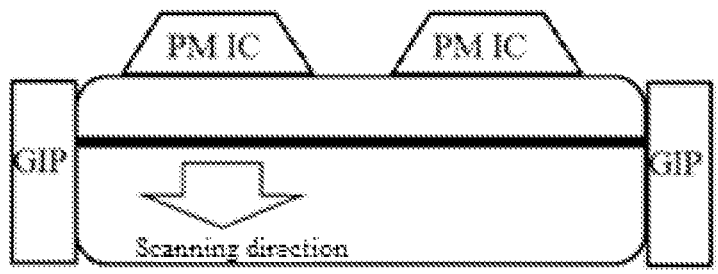
FIG. 25 is a schematic structural view of another specific example of a driving chip in a method of driving a display panel in the Embodiment of the present application.

In an alternative example, as shown in FIG. 25, which is substantially same as the above examples excepting that the data signal is transmitted to the data line through a driving chip, and the driving chip is a PMOLED driving chip (PM IC); the scanning signal is transmitted to a scanning line through a shift register circuit (such as a GIP circuit), thus the controlling manner is simple.

Figure 26A:
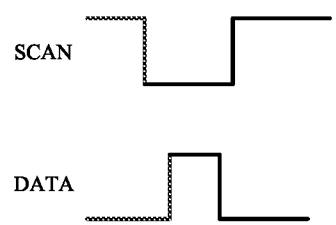
FIG. 26A is a waveform of a specific example of a data signal and a scanning signal in a method of driving a display panel in the Embodiment of the present application.
Figure 26B:
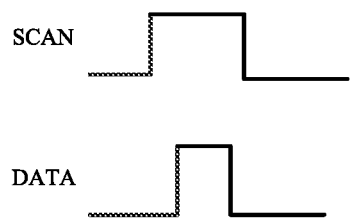
FIG. 26B is a waveform of another specific example of a data signal and a scanning signal in a method of driving a display panel in the Embodiment of the present application.

The number of PM IC and GIP shown in FIGS. 24 and 25 is only for illustration purposes and is not limited thereto. The scanning signal and the data signal are generated by the IC of the PMOLED; a current at the time of charging and discharging of the light emitting device needs to be calculated to determine the aspect ratio and voltage of the switching device; the specific voltage setting is determined by the IC output capability and a simulation test. When the switching device is a P-type driving TFT, the scanning signal is driven by a low voltage, and the waveforms of the scanning signal and the data signal are shown in FIG. 26A; when the switching device is an N-type driving TFT, and the scanning signal is driven by a high voltage, the waveforms of the scanning signal and the data signal are as shown in FIG. 26B.

Figure 27:
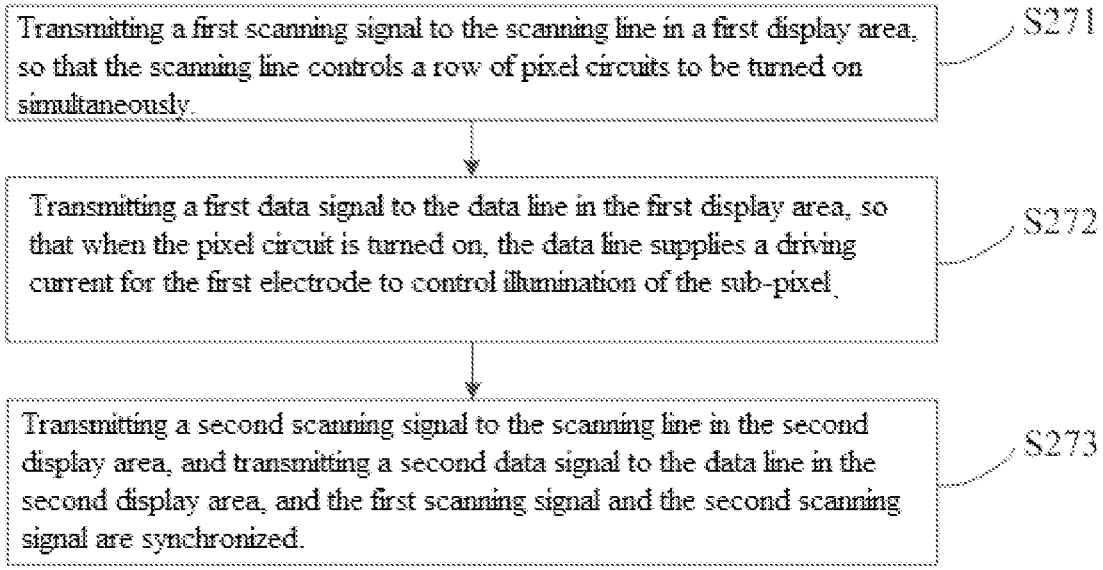
FIG. 27 is a flow chart showing a specific example of a method for driving a display screen in the Embodiment of the present application.

The example further provides a method for driving the display screen in any one of the above embodiments, and the display screen comprises a first display area and a second display area, in other words, the display screen is a composite screen comprising at least two screens. As shown in FIG. 27, the method comprises the following steps S271-S273:

Step S271: transmitting a first scanning signal to the scanning line in a first display area, so that the scanning line controls a row of pixel circuits to be turned on simultaneously;

Step S272: transmitting a first data signal to the data line in the first display area, so that when the pixel circuit is turned on, the data line supplies a driving current for the first electrode to control illumination of the sub-pixel;

Step S273: transmitting a second scanning signal to the scanning line in the second display area, and transmitting a second data signal to the data line in the second display area, and the first scanning signal and the second scanning signal are synchronized. In order to ensure that the first display area and the second display area display corresponding content, it is necessary to drive the first display area and the second display area for displaying by synchronous signals. In other words, triggering signals at the same time to start a scanning process in the first display area and the second display area. However a frequency of the first scanning signal and the frequency of the second scanning signal may be different, preferably, the frequency of the first scanning signal is an integer multiple of the frequency of the second scanning signal, or the frequency of the second scanning signal is an integer multiple of the frequency of the first scanning signal. Thus, triggering the scanning signal at the same time is beneficial to the synchronous displaying of the picture.

In an alternative example which is substantially same as the above examples excepting that a first scanning signal and a first data signal are transmitted by a first driving chip, and a second scanning signal and a second data signal are transmitted by a second driving chip, and the first driving chip is a PMOLED driving chip. The type of the second driving chip can be determined according to the type of the panel in the second display area. If the panel in the second display area is AMOLED, the second driving chip is an AMOLED driving chip, and if the panel in the second display area is PMOLED, the second driving chip is a PMOLED driving chip.

In an alternative example which is substantially same as the above examples excepting that a specialized driving chip may also be applied according to the type of the panel in the first display area and the second display area, such that the first scanning signal, the first data signal, the second scanning signal, and the second data signal can be transmitted by the same driving chip. Synchronization of the first scanning signal and the second scanning signal can be realized in the specialized chip.

In an alternative example which is substantially same as the above examples excepting that when a display panel in the second display area is an AMOLED display panel, a second scanning signal is transmitted to a scanning line in the second display area, and a second data signal is transmitted to a data line in the second display area. Specifically the second scanning signal is transmitted to the scanning line in the second display area, and the second data signal is transmitted to the data line in the second display area, so as to control the current in the power line to be input to corresponding sub-pixels through the driving transistor, thus controlling the luminance of corresponding sub-pixels, thereby achieving a separate control of the composite screen.

As another alternative example which is substantially same as the above examples excepting that when the composite screen comprises three or more screens, the composite screen can be controlled by the following manner that each separate display area can be driven separately and driven by the synchronous signal to display synchronously. The above manner also falls within the scope of present application.

In addition, if the area of the first display area is much smaller than the displaying area of the second display area, the scanning manner of the second display area may not limited to a top-to-bottom or bottom-to-top scanning manners as shown in FIG. 24 and FIG. 25. In order to facilitate a display synchronization of the first display area and the second display area, a scanning can be started from a middle position of the second display area and sequentially towards both ends.

Although the embodiments of the present application have been described with reference to the drawings, various modifications and variation can be made by those skilled in the art without departing from the spirit and scope of present application. Such modifications and variations fall within the scope defined by the claims.

The invention claimed is:

1. A display panel, comprising:
a substrate;
a plurality of pixel circuits, disposed on the substrate;
a first electrode layer, disposed on the pixel circuit and comprising a plurality of first electrodes;
a pixel defining layer, disposed on the first electrode and defining a plurality of openings thereon, a light emitting structure layer being disposed in the opening of the pixel defining layer to form a plurality of sub-pixels;
a second electrode, disposed on the light emitting structure layer;
a plurality of scanning lines and a plurality of data lines connected to the pixel circuit;
wherein the plurality of pixel circuits have a one-to-one correspondence with the plurality of first electrodes, the plurality of sub-pixels have a one-to-one correspondence with the plurality of first electrodes, the second electrode is a surface electrode, the plurality of scanning lines control the turning on and turning off of the plurality of the pixel circuits, and when the plurality of pixel circuits are turned on, the plurality of data lines provide a drive current for the plurality of first electrodes to control illumination of the plurality of sub-pixels,
wherein each of the plurality of pixel circuits comprises a single switching device, and the switching device comprises a first terminal, a second terminal, and a control terminal; and one of the plurality of scanning lines are connected to the control terminal of the switching device, one of the plurality of data lines are connected to the first terminal of the switching device, and one of the plurality of the first electrodes is directly connected to the second terminal of the switching device to receive the drive current supplied from one of the plurality of data lines,
wherein the plurality of scanning lines extend in parallel along a first direction, one side of each of the plurality of scanning lines in the extending direction has a wave shape, wherein a first pitch is disposed between adjacent scanning lines, and the first pitch changes continuously or intermittently,
wherein each of the plurality of first electrodes is an anode, the second electrode is a cathode, and the plurality of data lines are disposed in the same layer as the first electrodes.

2. The display panel according to claim 1, wherein the switching device is a driving thin film transistor, and the first terminal is a source or a drain of the driving thin film transistor, the second terminal is a drain or a source of the driving thin film transistor, the control terminal is a gate of the driving thin film transistor; and the driving thin film transistor has a top gate structure or a bottom gate structure.

3. The display panel according to claim 2, wherein the plurality of scanning lines are disposed in the same layer as the gate; or the plurality of scanning lines are disposed above or below the gate.

4. The display panel according to claim 1, wherein one or more members of the group consisting of the plurality of first electrodes, the second electrode, the plurality of data lines, and the plurality of scanning lines, are made of a transparent conductive material.

5. The display panel according to claim 4, wherein the transparent conductive material is indium tin oxide, indium zinc oxide, silver-doped indium tin oxide or silver-doped indium zinc oxide.

6. The display panel according to claim 1, wherein the plurality of data lines extend in parallel along a second direction, the first direction intersects with the second direction, one side of each of the plurality of data lines in the extending direction thereof has a wave shape.

7. The display panel according to claim 6, wherein
a second pitch is disposed between adjacent data lines, and the second pitch changes continuously or intermittently; or
a width of each of the plurality of scanning lines changes continuously or intermittently; or
a width of each of the plurality of data lines changes continuously or intermittently.

8. The display panel according to claim 6, wherein both sides of each of the plurality of scanning lines in the extending direction have a wave shape, and wave peaks of the two sides are oppositely disposed, and wave troughs are oppositely disposed; and/or
both sides of each of the plurality of data lines in the extending direction have a wave shape, and wave peaks of the two sides are oppositely disposed, and wave troughs are oppositely disposed.

9. The display panel according to claim 8, wherein a first connecting portion is formed at a corresponding position of the wave troughs of each of the plurality of scanning lines; and the first connecting portion is strip-shaped; or
a second connecting portion is formed at a corresponding position of the wave troughs of each of the plurality of data lines, and the second connecting portion is strip-shaped; or
the first connecting portion is an electrical connecting area of each of the plurality of scanning lines and the switching device; or
the second connecting portion is an electrical connecting area of each of the plurality of data lines and the switching device.

10. The display panel according to claim 1, wherein the first electrode is circular, elliptical or dumbbell shaped.

11. The display panel according to claim 10, wherein the plurality of sub-pixels are circular, elliptical or dumbbell shaped.

12. A display screen, comprising at least a first display area and a second display area, and a photosensitive device being disposed below the first display area; wherein
the first display area is provided with the display panel of claim 1, and the second display area is provided with a passive matrix organic light emitting diode display panel or an active matrix organic light emitting diode display panel.

13. The display screen according to claim 12, wherein the display panel disposed in the second display area is an active matrix organic light emitting diode display panel, the cathode of the display panel of the first display area and the cathode of the display panel of the second display area share a full-surface electrode.

14. A method for controlling a display panel, wherein the display panel comprises:
a substrate;
a plurality of pixel circuits, disposed on the substrate;
a first electrode layer, disposed on the pixel circuit and comprising a plurality of first electrodes;
a pixel defining layer, disposed on the first electrode and defining a plurality of openings thereon, a light emitting structure layer being disposed in the opening of the pixel defining layer to form a plurality of sub-pixels;
a second electrode, disposed on the light emitting structure layer;
a plurality of scanning lines and a plurality of data lines connected to the plurality of pixel circuits;
wherein the plurality of pixel circuits have a one-to-one correspondence with the plurality of first electrodes, the plurality of sub-pixels have a one-to-one correspondence with the plurality of first electrodes, the second electrode is a surface electrode, the plurality of scanning lines control the turning on and turning off of the plurality of the pixel circuits, and when the plurality of pixel circuits are turned on, the plurality of data lines provide a drive current for the plurality of first electrodes to control illumination of the plurality of sub-pixels, wherein the plurality of scanning lines extend in parallel along a first direction, one side of each of the plurality of scanning lines in the extending direction has a wave shape, wherein a first pitch is disposed between adjacent scanning lines, and the first pitch changes continuously or intermittently
the method comprising:
transmitting a scanning signal to the plurality of scanning lines, wherein each of the plurality of scanning lines control a row of the plurality of pixel circuits to be turned on simultaneously;
transmitting a data signal to the plurality of data lines, wherein when the plurality of pixel circuits are turned on, the plurality of data lines supply a drive current to the plurality of first electrodes to control illumination of the plurality of sub-pixels,
wherein each of the plurality of pixel circuits comprises one single switching device, and the switching device comprises a first terminal, a second terminal, and a control terminal; and one of the plurality of scanning lines are connected to the control terminal of the switching device, one of the plurality of data lines are connected to the first terminal of the switching device, and one of the plurality of the first electrodes is directly connected to the second terminal of the switching device to receive the drive current supplied from one of the plurality of data lines, wherein each of the plurality of first electrodes is an anode, the second electrode is a cathode, and the plurality of data lines are disposed in the same layer as the first electrode.

15. The method according to claim 14, wherein a luminance brightness of the plurality of sub-pixels are controlled by controlling a pulse width of the plurality of data lines.

16. The control method according to claim 14, wherein the scanning signal or the data signal are transmitted to the plurality of scanning lines or the plurality of data lines through a driving chip.

17. The control method according to claim 16, wherein the driving chip is a passive matrix organic light emitting diode driving chip.

18. The control method according to claim 14, wherein the scanning signal is transmitted to the plurality of scanning lines through a shift register circuit.

\* \* \* \* \*